(12) United States Patent
Sato

(10) Patent No.: US 10,715,134 B2
(45) Date of Patent: Jul. 14, 2020

(54) POWER MODULE, REVERSE-CONDUCTING IGBT, AND DRIVE CIRCUIT

(71) Applicant: FUJI ELECTRIC CO., LTD., Kawasaki (JP)

(72) Inventor: Shigeki Sato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/556,947

(22) Filed: Aug. 30, 2019

(65) Prior Publication Data
US 2019/0386655 A1 Dec. 19, 2019

Related U.S. Application Data

(63) Continuation of application No. PCT/JP2018/029143, filed on Aug. 2, 2018.

(30) Foreign Application Priority Data

Sep. 15, 2017 (JP) .................... 2017-178412

(51) Int. Cl.
H03K 17/16 (2006.01)
H03K 3/012 (2006.01)
H03K 17/78 (2006.01)

(52) U.S. Cl.
CPC ........... *H03K 17/168* (2013.01); *H03K 3/012* (2013.01); *H03K 17/78* (2013.01)

(58) Field of Classification Search
CPC .............................. H03K 17/168; H03K 17/78
USPC .................... 327/108–112; 326/82, 83, 87
See application file for complete search history.

(56) References Cited

U.S. PATENT DOCUMENTS

| 5,977,814 A * | 11/1999 | Ishii | H03K 17/168 |
| | | | 327/108 |
| 5,986,484 A * | 11/1999 | Kimata | H03K 17/0828 |
| | | | 323/908 |
| 6,271,708 B1 * | 8/2001 | Hoshi | H03K 17/164 |
| | | | 327/377 |

(Continued)

FOREIGN PATENT DOCUMENTS

| JP | 2004-14218 A | 1/2004 |
| JP | 2009-55696 A | 3/2009 |

(Continued)

OTHER PUBLICATIONS

International Search Report dated Aug. 28, 2018 in corresponding International Patent Application No. PCT/JP2018/029143.

(Continued)

*Primary Examiner* — Tomi Skibinski

(57) ABSTRACT

A power module which includes a power semiconductor chip that includes an IGBT and a freewheeling diode formed in the same chip, and the power module includes a drive circuit that is connected to the power semiconductor chip and drives the IGBT on/off. The power module is configured by packaging the power semiconductor chip and the drive circuit, and is characterized by further including a capacitor and a switch element disposed in series between the emitter of the IGBT and the ground of the drive circuit. The switch element connects the emitter and the ground in the case where the drive circuit has the IGBT perform a turn off switching operation.

7 Claims, 3 Drawing Sheets

(56) References Cited

U.S. PATENT DOCUMENTS

| | | | |
|---|---|---|---|
| 2009/0058499 A1* | 3/2009 | Yamashiro | H03K 17/168 327/432 |
| 2012/0298890 A1* | 11/2012 | Adiga-Manoor | H03K 17/16 250/551 |
| 2014/0097876 A1 | 4/2014 | Yamashiro | |
| 2015/0162822 A1 | 6/2015 | Ho et al. | |
| 2018/0062634 A1 | 3/2018 | Shin | |
| 2018/0159526 A1 | 6/2018 | Inoue et al. | |

FOREIGN PATENT DOCUMENTS

| | | |
|---|---|---|
| JP | 2013-78258 A | 4/2013 |
| JP | 2013-517740 A | 5/2013 |
| JP | 2017-117540 A | 6/2017 |
| WO | 2006/013973 A1 | 2/2006 |
| WO | 2016/203691 A1 | 12/2016 |

OTHER PUBLICATIONS

Written Opinion of the International Searching Authority dated Aug. 28, 2018 in corresponding International Patent Application No. PCT/JP2018/029143.

* cited by examiner

POWER MODULE, REVERSE-CONDUCTING IGBT, AND DRIVE CIRCUIT

CROSS-REFERENCE TO RELATED APPLICATIONS

This application is a Continuation of PCT Application No. PCT/JP2018/029143 filed Aug. 2, 2018, which claims the benefit of Japanese Patent Application No. 2017-178412 filed Sep. 15, 2017. The disclosures of the prior applications are hereby incorporated by reference herein in their entireties.

TECHNICAL FIELD

The present invention relates to a power module, a reverse-conducting IGBT, and a drive circuit, and particularly to a power module, a reverse-conducting IGBT (an IGBT formed together with a freewheeling diode in the same chip), and a drive circuit with which it is possible to turn off an IGBT formed together with a freewheeling diode in the same chip at high speed.

BACKGROUND ART

In power semiconductor devices, for example, IGBTs, in order to make high-speed turning off possible, freewheeling diodes are used for drawing excess carrier of the emitter sides of the IGBTs. In the related art, it has been general to form a freewheeling diode in a chip different from the chip of an IGBT, and connect the IGBT chip and the freewheeling diode chip with wire or the like, and organize them into a single module with a resin or the like.

Technologies for improving the trade-off characteristic between noise which is generated during a turn off switching operation and switching loss in an IGBT having a freewheeling diode are known (see the following JP-A-2009-55696 and JP-A-2013-78258 for instance). According to this type of technologies, in the case of having an IGBT perform a turn off switching operation, until the voltage between the collector and emitter of the IGBT reaches a DC voltage which is applied between the collector and the emitter, the change rate of the collector-emitter voltage is set to be large, and after the collector-emitter voltage reaches the DC voltage, the change rate is set to be small.

Recently, further scaling down of power semiconductor devices has proceeded, and the configuration in which a freewheeling diode is formed in an IGBT chip has been mainstreamed. Even in this configuration, in terms of the control properties, it is important to turn off the IGBT at high speed, and the above-mentioned technologies are technologies for improving the trade-off characteristic between noise and switching loss in the case of forming an IGBT and a freewheeling diode in different chips. In other words, the above-mentioned technologies are not technologies considering the characteristics of a reverse-conducting IGBT configured by forming an IGBT and a freewheeling diode in the same chip. Therefore, in the case of applying the above-mentioned technologies to a reverse-conducting IGBT, in speeding up turn-off, a certain effect can be obtained, however, recently, it has been demanded to further speed up turn-off of reverse-conducting IGBTs, and the above-mentioned technologies have a limit in speeding up turn-off of reverse-conducting IGBTs. In other words, even though the above-mentioned technologies of the related art are applied, there is a limit in improving the control properties of the reverse-conducting IGBT.

SUMMARY

The present invention was made to solve the problem of the above-mentioned technologies of the related art, and an object of the present invention is to provide a power module, a reverse-conducting IGBT, and a drive circuit with which it is possible to improve the control properties of a reverse-conducting IGBT.

In order to achieve the above-mentioned object, a power module according to an aspect of the present invention is a power module which includes a power semiconductor chip that has an IGBT and a freewheeling diode formed in the same chip, and the power module includes a drive circuit that is connected to the power semiconductor chip and drives the IGBT on/off, and the power module is configured by packaging the power semiconductor chip and the drive circuit, and is characterized by further including a capacitor and a switch element disposed in series between the emitter of the IGBT and the ground of the drive circuit, wherein the switch element connects the emitter and the ground so as to suppress a change in a forward current of the freewheeling diode in the case where the drive circuit has the IGBT perform a turn off switching operation.

In the related art, a freewheeling diode is formed in a chip different from an IGBT chip; however, recently, a demand for forming a freewheeling diode in the same chip has been increasing. In the case of having a reverse-conducting IGBT perform turn off switching, the emitter potential and the gate potential change according to the instantaneous electromotive force based on parasitic L/C/R components existing inside and outside the chip. As the instantaneous electromotive force rises, the forward current of the freewheeling diode provided in the same chip steeply changes, and a large current flows in the freewheeling diode for quickly returning excess carrier of the emitter side during turn off switching to the collector side, so the control properties of the reverse-conducting IGBT deteriorate. The values of the above-mentioned parasitic L/R components are designed to be the minimums, and due to the restrictions on the chip design, it is relatively difficult to control those values. For this reason, a capacitor is provided between a switch element for driving the IGBT and the ground of the drive circuit, in order to suppress a rise in the instantaneous electromotive force which is generated in the case of having the reverse-conducting IGBT perform turn off switching, and a steep change in the forward current of the freewheeling diode. In this case, since it becomes possible for the reverse-conducting IGBT to be turned off at high speed, it is possible to make the control properties thereof good.

Also, in order to achieve the above-mentioned object, a reverse-conducting IGBT according to another aspect of the present invention is a reverse-conducting IGBT which includes an IGBT that includes a trench gate structure, a freewheeling diode that includes a trench gate structure and formed in the same chip, and is characterized by being connected to a drive circuit including a switch element for connecting the emitter of the reverse-conducting IGBT and a ground in the case of having the reverse-conducting IGBT perform a turn off switching operation, and including a capacitor disposed in series between the emitter and the switch element.

Further, in order to achieve the above-mentioned object, a drive circuit according to a further aspect of the present invention is a drive circuit which drives a power semiconductor chip on/off configured by forming an IGBT including a trench gate structure and a freewheeling diode including a trench gate structure in the same chip, and is characterized by including a switch element that connects the emitter of the IGBT and a ground in the case of having the IGBT perform a turn off switching operation, and a capacitor disposed in series between the emitter and the switch element.

According to the present invention, it becomes possible to provide a power module, a reverse-conducting IGBT, and a drive circuit with which it is possible to improve the control properties of a reverse-conducting IGBT.

DETAILED DESCRIPTION OF EMBODIMENTS

Hereinafter, an embodiment of the present invention will be described in detail with reference to the drawings. One of features of the present invention is, for example, that, a capacitor for suppressing change in the emitter potential of an IGBT (hereinafter, also referred to as a reverse-conducting IGBT) which has a freewheeling diode formed in the same chip and is a reverse-conducting IGBT using a trench gate structure.

Recently, a demand for forming a freewheeling diode and an IGBT in the same chip has been increasing. The reason is that by forming a freewheeling diode together with an IGBT in the same chip, it is possible to improve the maximum current rating of the module package. Meanwhile, since the freewheeling diode is caused to flow a large current, the number of carriers also increases, and excess carrier which remains when turn off switching of the IGBT is performed also increases. Excess carrier is a cause of noise during a turn off switching operation. In the related art, since a freewheeling diode is formed in a chip different from a chip for an IGBT, even if a large current flows in the freewheeling diode, it is relatively difficult for the large current to influence the IGBT formed in the different chip. Therefore, in the case of an IGBT (hereinafter, also referred to as a reverse-conducting IGBT) having a freewheeling diode formed in the same chip, it is required to consider the influence of noise which is caused when a large current flows in the freewheeling diode. An example of such noise is a rise in instantaneous electromotive force.

Figure 1:
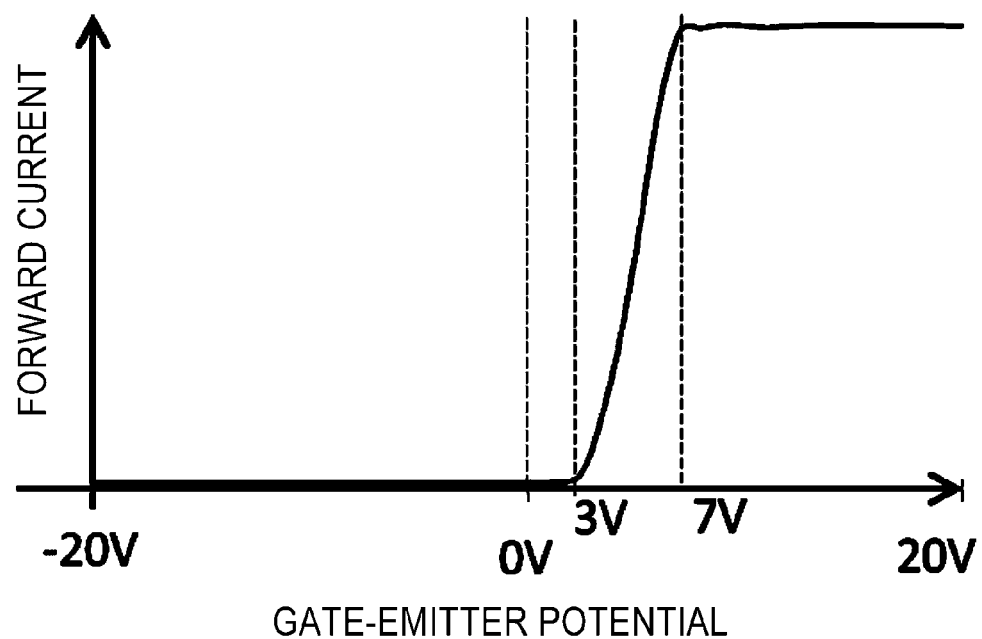
FIG. 1 is a graph illustrating the relation between the gate-emitter potential and the forward current which flows in a freewheeling diode, in a reverse-conducting IGBT.

When turn off switching of the reverse-conducting IGBT is performed, a large current flows in a freewheeling diode region in the same chip. As a result, in a very short period until the reverse-conducting IGBT is completely turned off (i.e. a period when the reverse-conducting IGBT is in a turn-off transient state), an instantaneous electromotive force is generated, and the emitter potential and the gate potential temporarily rise. This becomes a cause of noise, and deteriorates the control properties of the reverse-conducting IGBT. In other words, in order to completely turn off the reverse-conducting IGBT, it is required to release the charge stored in the gate; however, generation of the instantaneous electromotive force interferes with release of the charge stored in the gate of the reverse-conducting IGBT, and becomes an obstacle to making the turn off switching characteristic good. As shown in the graph of FIG. 1, in the reverse-conducting IGBT having the trench gate structure, when the gate potential thereof is between about 3 V and about 7 V, the forward current flowing in the freewheeling diode has a steep change point.

In other words, it can be seen that when the reverse-conducting IGBT is turned off, a constant large current (remaining of excess carrier) continuously flows in the freewheeling diode until the gate potential lowers to a predetermined value. Since this is a cause of a rise in the instantaneous electromotive force, if it is possible to suppress the rise in the instantaneous electromotive force, it is possible to suppress noise during the turn off switching operation of the reverse-conducting IGBT, and improve the control properties of the reverse-conducting IGBT.

It is known that such instantaneous electromotive force e has the following relations with L, C, and R components parasitic to the inside and outside of the IGBT chip.

$$e = IR \tag{1}$$

$$e = L \, di/dt \tag{2}$$

$$e = (1/C) \int i \, dt \tag{3}$$

Herein, I is current, and R is wire resistance, and L is wire inductance, and C is wire capacitance.

In view of the above expressions (1) to (3), if it is possible to reduce the instantaneous electromotive force e, it is possible to suppress change in the emitter potential and the gate potential and suppress generation of noise. Meanwhile, the L component and the R component mentioned above are designed to the minimums in terms of the chip structure. For this reason, the inventor of the present invention achieved improvement in view of C components. Hereinafter, a specific embodiment with which the control properties of reverse-conducting IGBTs have been improved in view of C components will be described in detail.

(Configuration)

Figure 2:
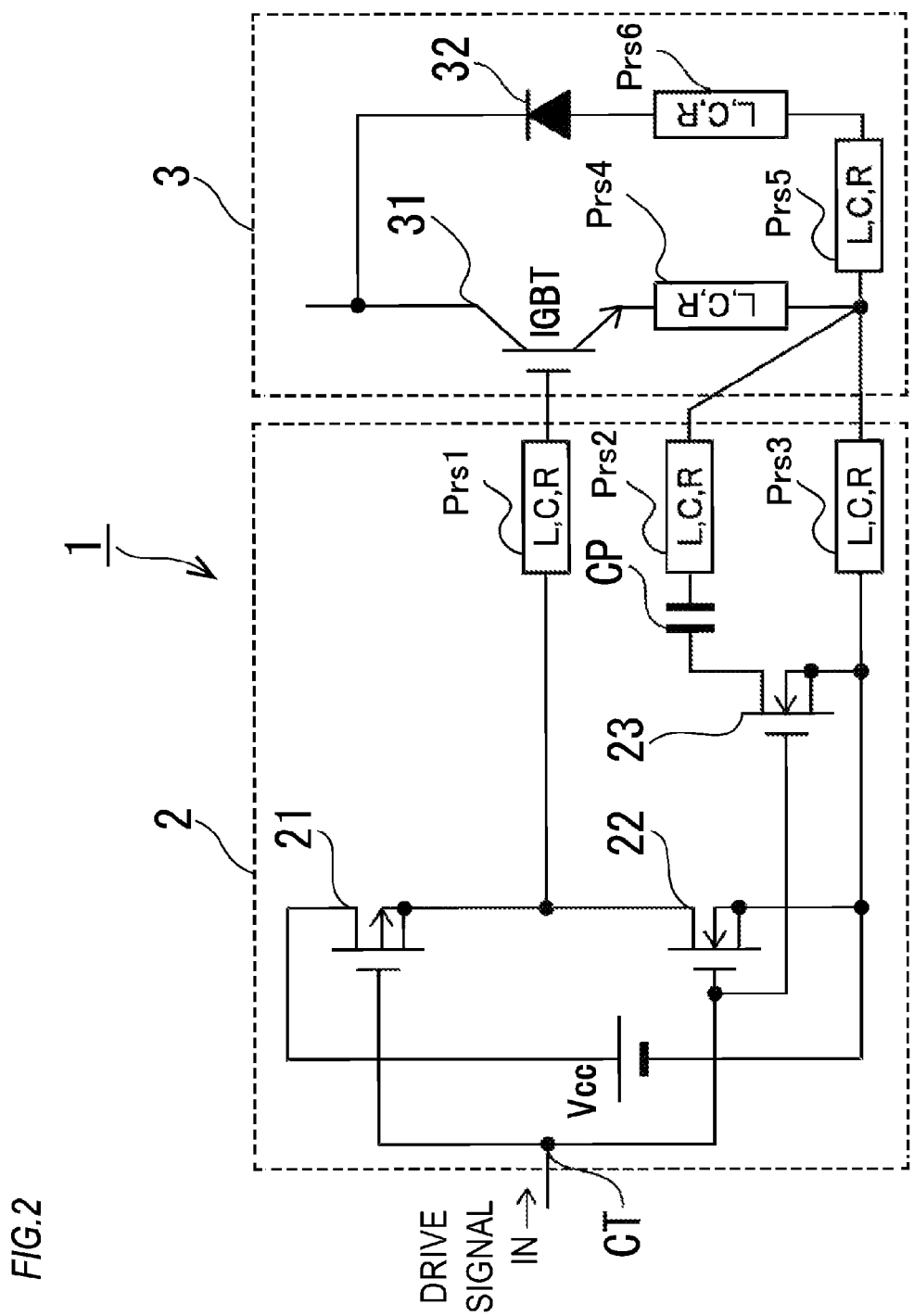
FIG. 2 is a circuit diagram illustrating the configuration of a power module according to an embodiment of the present invention.

As shown in FIG. 2, a power module 1 according to an embodiment of the present invention includes a drive circuit 2 and a power semiconductor chip 3. Also, L, C, and R in the drawings are examples of components parasitic to wires. In the present embodiment, the attention is focused on, as an example, parasitic L/C/R components prs1 on wires which are connected to the gate of an IGBT 31 to be described below, and parasitic L/C/R components prs2 to prs4 on wires which are connected to its emitter, and parasitic L/C/R components prs5 and prs6 on wires which extend from its emitter to a freewheeling diode 32 to be described below.

For example, the power module 1 is an IPM (Intelligent Power Module), and the drive circuit 2 and the power semiconductor chip 3 are connected with wires of copper (Cu) or the like, and are sealed with a resin, thereby being packaged into one module.

The drive circuit 2 is, for example, a chip or a board having a printed circuit pattern, and is configured to include a first MOSFET 21 and a second MOSFET 22 connected in series with each other, a power supply Vcc that is connected between both ends of the series circuit of the first MOSFET 21 and the second MOSFET 22, a third MOSFET 23 that shares a ground with the series circuit of the first and second MOSFETs 21 and 22, and a drive signal input terminal CT that is connected to each of the gates of the first to third MOSFETs 21 to 23, and a capacitor CP disposed between the emitter of the IGBT 31 to be described below and the drain of the third MOSFET 23. The number of MOSFETs which the drive circuit 2 includes is an example, and can be appropriately changed according to the actual purpose and so on.

The first MOSFET 21 is, for example, a P-type MOSFET, and its drain is connected to the power supply Vcc, and its gate is connected to the drive signal input terminal CT, and its source is connected to the gate of the IGBT 31. In the case of turning on the IGBT 31, according to a drive signal IN which is input via the drive signal input terminal CT, only the first MOSFET 21 is turned on (to be conductive), such that the voltage of the power supply Vcc is applied to the gate of the IGBT 31. Meanwhile, in the case of turning off the IGBT 31, the first MOSFET 21 is turned off (to be non-conductive), such that the voltage of the power supply Vcc is not applied to the gate of the IGBT 31.

The second MOSFET 22 is, for example, an N-type MOSFET, and its drain is connected to the gate of the IGBT 31, and its gate is connected to the drive signal input terminal CT, and its sources is grounded. In the case of turning off the IGBT 31, according to the drive signal IN, the second MOSFET 22 is turned on to connect the gate of the IGBT 31 and the ground, whereby the potential of the gate of the IGBT 31 is lowered.

The third MOSFET 23 is, for example, an N-type MOSFET, and its drain is connected to the emitter of the IGBT 31 via the capacitor CP, and its gate is connected to the drive signal input terminal CT, and its source is grounded. In the case of turning off the IGBT 31, according to the drive signal IN, the third MOSFET 23 is switched to the conductive state. The third MOSFET 23 is for securing the OFF state and stable potential of the IGBT 31. For this reason, the third MOSFET 23 does not need to be particularly a MOSFET, and may be, for example, a bipolar transistor or a mechanical switch. Also, the third MOSFET 23 is also a path switch element for charging the capacitor CP with charge stored in the emitter of the IGBT 31. Details of the operation of the third MOSFET 23 for charging the capacitor CP will be described below. Also, the third MOSFET 23 may be provided in the chip or board of the drive circuit 2, or may be provided as an external element outside the chip in the case where it is difficult to provide the third MOSFET inside the chip due to the restrictions on the chip layout and so on.

The drive signal input terminal CT is a terminal to which the drive signal IN for switching the first to third MOSFETs 21 to 23 between the conductive state and the non-conductive state is input. Also, the power supply Vcc is a DC power supply for applying a gate voltage to the gate of the IGBT 31.

One end of the capacitor CP is connected to the drain of the third MOSFET 23, and the other end is connected to the emitter of the IGBT 31, such that the capacitor draws charge remaining in the emitter of the IGBT 31 according to the above-mentioned instantaneous electromotive force e in the case of turning off the IGBT 31. Similarly to the third MOSFET 23, the capacitor CP may be provided in the chip or board of the drive circuit 2, or may be provided as an external element outside the chip in the case where it is difficult to provide the capacitor inside the chip due to the restrictions on the chip layout and so on.

The power semiconductor chip 3 is configured to include, for example, the IGBT 31 and the freewheeling diode 32. The power semiconductor chip 3 has the IGBT 31 and the freewheeling diode 32 formed in the same chip, and the entire chip acts as a single reverse-conducting IGBT.

The IGBT 31 is, for example, a vertical type IGBT which has a trench gate structure and in which the current flows in the vertical direction of the board.

The freewheeling diode 32 returns excess carrier of the emitter side of the IGBT 31 to the collector side of the IGBT 31 in the case of turning off the IGBT 31. Since the freewheeling diode 32 also is formed together with the IGBT 31 in the same chip, it uses a trench structure. By forming the freewheeling diode 32 in the trench structure similarly to the IGBT 31, for example, the problem of lowering of the breakdown voltage is avoided.

(Operation)

Now, the operation of the power module 1 using the above-described configuration will be described with reference to FIG. 2 and FIG. 3. Since the present invention is characterized by the operation which is performed in the case where turn off switching of the IGBT 31 is performed, hereinafter, the operation which is performed in the case where turn off switching of the IGBT 31 is performed will be described.

In the case where turn off switching of the IGBT 31 is performed, on the basis of the drive signal IN input via the drive signal input terminal CT, the first MOSFET 21 is turned off. As a result, the power supply Vcc and the gate of the IGBT 31 are disconnected, and supply of the voltage which is applied from the power supply Vcc to the gate of the IGBT 31 stops. Also, on the basis of the drive signal IN, the second MOSFET 22 is turned on. As a result, the ground of the drive circuit 2 and the gate of the IGBT 31 are connected, and the charge in the gate is drawn, and the IGBT 31 performs a turn off switching operation.

Further, on the basis of the drive signal, the third MOSFET 23 is turned on. As a result, the ground of the drive circuit 2 and the emitter of the IGBT 31 are connected. Therefore, the freewheeling diode 32 returns excess carrier of the emitter side to the collector side.

Immediately after the IGBT 31 starts the turn off switching operation, as described above, the gate potential and the emitter potential change according to the instantaneous electromotive force e, and the characteristics of the forward current which flows in the freewheeling diode 32 connecting the emitter and collector of the IGBT 31 steeply change. However, in the present embodiment, between the emitter of the IGBT 31 and the third MOSFET 23, the capacitor CP is provided. This capacitor starts to be charged immediately after the IGBT 31 starts the turn off switching operation. In other words, if the third MOSFET 23 is turned on, one end of the capacitor CP is connected to the ground, so the charge remaining in the emitter of the IGBT 31 according to the instantaneous electromotive force e is drawn by the capacitor CP. As a result, change in the emitter potential is suppressed. Therefore, since change in the emitter potential attributable to the above-mentioned instantaneous electromotive force e is suppressed, a steep change in the forward current of the freewheeling diode 32 attributable thereto is suppressed, and it is possible to turn off the IGBT 31 at high speed. Therefore, it is possible to make the control properties of the IGBT 31 good.

Figure 3:
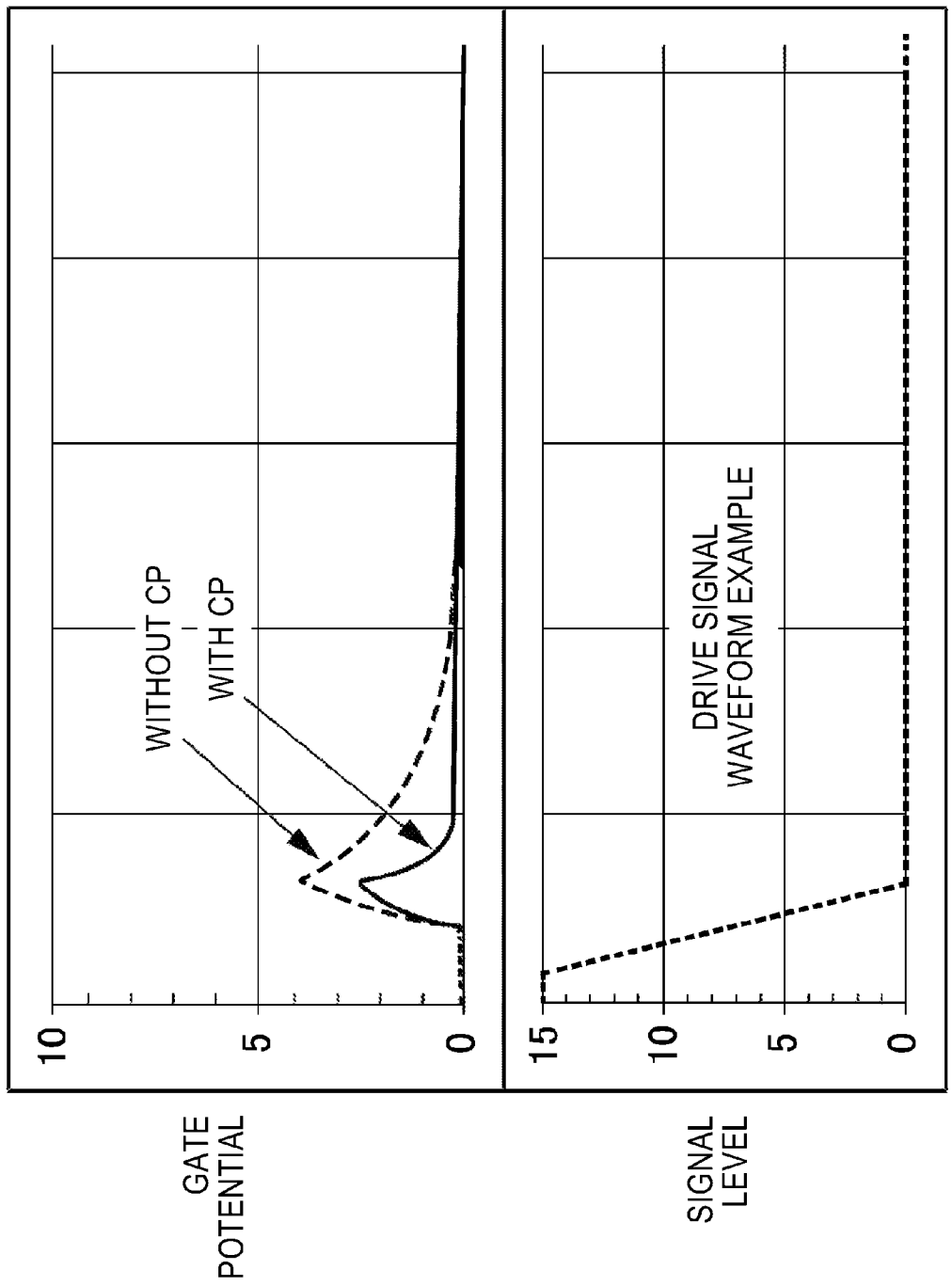
FIG. 3 is an actually measured waveform chart illustrating the relation between a drive signal and gate potential.

The actually measured waveform charts of the gate voltage during turn off switching operations in the case of using the configuration of the present embodiment and the case of a general configuration which does not use the configuration of the present embodiment are shown in FIG. 3. As shown in FIG. 3, while the signal which drives the IGBT 31, i.e. the voltage which is applied to the gate of the IGBT 31 (in FIG. 3, a drive signal waveform example) changes from the H level (for example, 15 V) to the L level (for example, 0 V), the voltage of the gate of the IGBT 31 changes according to the above-mentioned instantaneous electromotive force e; however, in the case of using the configuration of the present embodiment, as compared to the case of the general configuration, the steepness of rising is suppressed, and the time required to become about 0 V is shorter. It can be seen that immediately after turn off switching of the IGBT 31 is performed, the capacitor CP provided between the emitter of the IGBT 31 and the ground requires a large amount of charge during charging, and stores the charge, so it is possible to suppress change in the voltage of the gate.

The present invention is not limited to the above-described embodiment, and various applications and changes are possible. For example, in the above-described embodiment, the case where the capacitor CP is provided on the drive circuit (2) side has been described as an example. However, the capacitor CP can be provided on the power semiconductor chip (3) side. In this case, for example, the capacitor CP may be formed as a diffusion capacitance inside the power semiconductor chip 3, for example, in the emitter region. Then, one end of the capacitor CP is connected to the emitter and the other end is connected to an external terminal (not shown in the drawings) of the power semiconductor chip 3, so as to be connected to the drain of the MOSFET 23 via the external terminal.

Also, in the above-described embodiment, the case where the drive circuit 2 has the positive power supply Vcc has been described as an example. However, the present invention is not limited thereto, and can also be applied to the case of supplying a reverse bias to the gate of the IGBT 31. In this case, the connection relation of a negative power supply for supplying the reverse bias and the individual MOSFETs provided in the drive circuit 2 may be appropriately changed.

Besides, in the above-described embodiment, the case where the drive circuit 2 is a chip or a board having a printed circuit pattern has been described as an example; however, the present invention is not limited to this case. For example, the drive circuit 2 may be provided inside the power semiconductor chip 3. In this case, the drive circuit 2 can be provided in an insulation area which is not an active part in the power semiconductor chip 3 and is an insulation area where pads such as the collector, the emitter, and the gate are disposed. As an example of this insulation area, an area on an insulting film positioned on a p-well can be taken.

In the above-described embodiment, in order to facilitate understanding of the present invention, the case where the number of IGBTs 31 is one has been described as an example. In actual products, the number of IGBTs 31 is two or more, and for example, there is the case of configuring a half bridge circuit in which two IGBTs 31 are connected in series. Even in this case, the present invention can be applied to the high side and low side of the half bridge circuit, and by providing capacitors CP which are connected to the emitters of the individual IGBTs 31, it is possible to obtain the above-described effects without drastically change the existing circuit configuration. For example, in the case of applying the present invention to the high side, in order to make it possible to surely drive the IGBT 31 provided on the high side, in the drive circuit 2, a configuration suitable for use as a high-side driver, such as a charge pump circuit or a level shift circuit, may be appropriately added.

The invention claimed is:

1. A power module which includes a power semiconductor chip that includes an IGBT and a freewheeling diode formed in the same chip, and the power module includes a drive circuit that is connected to the power semiconductor chip and drives the IGBT on/off, and the power module is configured by packaging the power semiconductor chip and the drive circuit, further comprising:
   a capacitor and a switch element disposed in series between the emitter of the IGBT and the ground of the drive circuit,
   wherein the switch element connects the emitter and the ground so as to suppress a change in a forward current of the freewheeling diode in the case where the drive circuit has the IGBT perform a turn off switching operation.

2. The power module according to claim 1, wherein the switch element is a MOSFET.

3. The power module according to claim 1, wherein the IGBT is a vertical type IGBT using a trench gate structure.

4. The power module according to claim 1, wherein the capacitor is formed inside the drive circuit.

5. The power module according to claim 1, wherein the capacitor is formed inside the power semiconductor chip.

6. A reverse-conducting IGBT comprising:
   an IGBT that includes a trench gate structure; and
   a freewheeling diode that includes a trench gate structure and formed in the same chip;
   wherein the reverse-conducting IGBT is connected to a drive circuit including a switch element for connecting the emitter of the reverse-conducting IGBT and a ground in the case of having the reverse-conducting IGBT perform a turn off switching operation, and
   wherein the reverse-conducting IGBT includes a capacitor disposed in series between the emitter and the switch element.

7. A drive circuit which drives a power semiconductor chip on/off configured by forming an IGBT including a trench gate structure and a freewheeling diode including a trench gate structure in the same chip, comprising:
   a switch element that connects the emitter of the IGBT and a ground in the case of having the IGBT perform a turn off switching operation; and
   a capacitor disposed in series between the emitter and the switch element.

* * * * *